United States Patent [19]

Norris

[11] Patent Number: 5,218,571
[45] Date of Patent: Jun. 8, 1993

[54] EPROM SOURCE BIAS CIRCUIT WITH COMPENSATION FOR PROCESSING CHARACTERISTICS

[75] Inventor: Chris Norris, Sunnyvale, Calif.

[73] Assignee: Cypress Semiconductor Corporation, San Jose, Calif.

[21] Appl. No.: 819,606

[22] Filed: Jan. 9, 1992

Related U.S. Application Data

[63] Continuation of Ser. No. 519,904, May 7, 1990, abandoned.

[51] Int. Cl.$^5$ ............................................. G11C 16/06
[52] U.S. Cl. .............................. 365/189.09; 365/185; 365/211; 365/212
[58] Field of Search ........... 365/104, 184, 185, 189.09, 365/230.06, 211, 212

[56] References Cited

U.S. PATENT DOCUMENTS

| | | | |
|---|---|---|---|
| 4,542,485 | 7/1985 | Iwahashi et al. | 365/230.06 |
| 5,051,953 | 9/1991 | Kitazawa et al. | 365/185 |

FOREIGN PATENT DOCUMENTS

| | | | |
|---|---|---|---|
| 0152594 | 9/1982 | Japan | 365/185 |
| 0077700 | 5/1984 | Japan | 365/104 |
| 0087697 | 5/1984 | Japan | 365/104 |

*Primary Examiner*—Glenn Gossage
*Attorney, Agent, or Firm*—Larry K. Roberts

[57] ABSTRACT

An electrically programmable read only memory (EPROM) source bias circuit provides a bias voltage at the source of an EPROM transistor which may vary with EPROM processing characteristics. The source bias circuit includes a reference voltage generator which generates a reference voltage which varies with EPROM transistor cell conductivity, and a source bias element which sets the voltage on the source node of the EPROM transistor during programming. The circuit functions to provide a greater amount of source bias to a higher-conductivity EPROM cell during programming, and to apply a lower source bias voltage to low conductivity EPROM cells. Programming efficiency of the EPROM transistor is improved, and yield of EPROM devices employing the circuit is enhanced.

24 Claims, 5 Drawing Sheets

EPROM SOURCE BIAS CIRCUIT WITH COMPENSATION FOR PROCESSING CHARACTERISTICS

This is a continuation of copending application Ser. No. 07/519,904 filed on May, 7, 1990, now abandoned.

BACKGROUND OF THE INVENTION

The present invention relates to electrically programmable read only memory (EPROM) memory cells, and more particularly to an improved source bias generator circuit for aiding the programming efficiency of the EPROM cells.

EPROM memory cells employing hot electron programming techniques are programmed by application of high programming voltages to the gate and drain of the EPROM device during programming cycles. Process dependent characteristics of EPROM transistors affect the operating characteristics of the device during the programming cycle. For example, transistors characterized as "fast process corner" devices draw a relatively large current through the transistor during the programming cycle, and require relatively low voltages across the drain-to-source regions of the transistor in order to program. The drain-to-source programming voltage can get high enough so that the transistor goes into a breakdown condition (e.g., punchthrough and/or snapback) which can result in catastrophic damage to the chip or programming functional failure. EPROM transistors characterized as "slow process corner" devices have relatively low current through the drain-to-source channel, and subsequently require a relatively higher drain-to-source programming voltage in order to program.

"Fast process corner" characteristics are the processing characteristics that cause transistors to conduct higher currents than typical or nominal transistors under identical biasing conditions. "Slow process corner" characteristics are those processing characteristics that cause transistors to conduct less current than typical or nominal transistors under identical biasing conditions.

One prior method previously considered to improve EPROM programming is to intentionally increase the passive resistance of the EPROM cell's source node. Using a passive resistance has the drawback of not tracking with the process variations that affect EPROM programming efficiency. This lack of tracking results in decreased programming efficiency in many process corners, and fails to fully optimize programming efficiency for each specific device.

It is therefore an object of the present invention to provide a circuit for improving the programming efficiency of an EPROM memory cell that uses hot electron programming techniques.

A further object of the invention is to provide a source bias generator circuit which biases the voltage at the EPROM transistor source so as to track with the process variations that affect EPROM programming efficiency.

SUMMARY OF THE INVENTION

These and other objects and advantages are achieved by circuitry for improving the programming efficiency of a floating gate transistor characterized by respective gate, drain and source nodes, and programmed by hot electron programming techniques. The circuitry comprises a process-dependent reference voltage generator comprising means for generating a reference voltage during the programming cycle. The circuitry further includes a source bias element means responsive to the reference voltage for biasing the voltage on the transistor source node during programming, such that lower source voltages are set when the transistor conductivity is low and for setting higher source voltages when the transistor conductivity is high.

In one preferred embodiment, the source bias element comprises the parallel connection of a passive resistance and an active resistance element such as an MOS transistor which is responsive to the reference voltage to provide a decreased resistance as the reference voltage increases.

In the disclosed embodiments, the reference voltage generated by the generator is dependent on the conductivity of the transistor to be programmed, wherein the reference voltage varies in dependence on the floating gate transistor processing characteristics. The reference generator may include, for example, a mirror floating gate transistor whose conductivity tracks that of the floating gate transistor to be programmed, so that the reference voltage is dependent on the conductivity of the mirror transistor.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
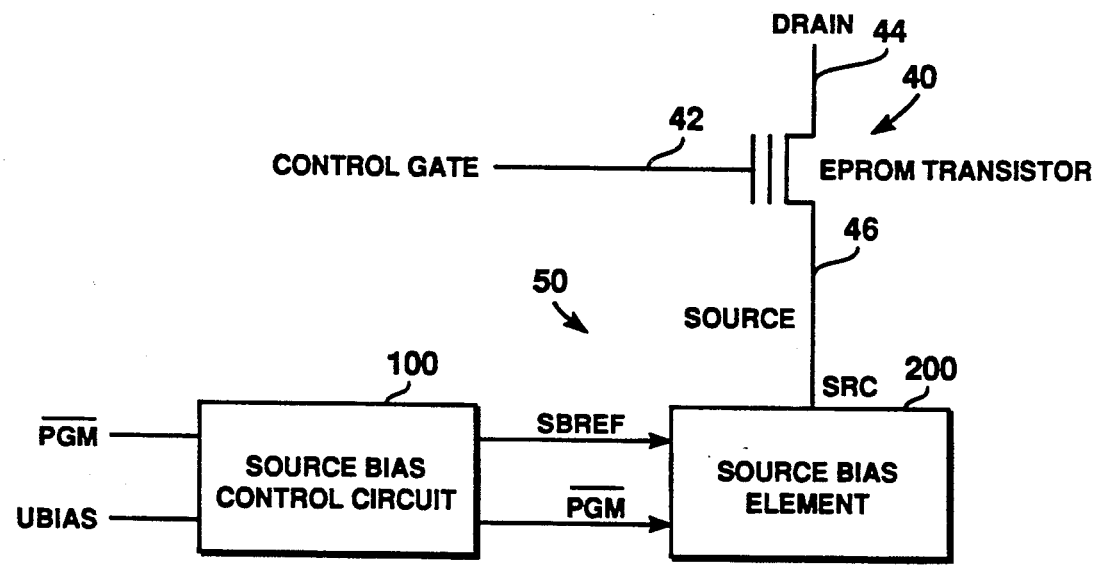
FIG. 1 is a simplified block diagram of an EPROM source bias generator in accordance with the invention.

A source bias generator circuit 50 embodying the present invention is illustrated in block diagram form in FIG. 1. The circuit 50 is employed to set the voltage bias at the source 46 of an EPROM transistor 40, characterized in conventional fashion by a control gate 42, drain 44 and the source 46. The source bias circuit 50 comprises a source bias control circuit 100 and a source bias element 200 connected to the source 46 of the EPROM transistor 40. The source bias control circuit 100 receives input control signals PGM (active only during the device program mode) and UBIAS, and generates a reference voltage signal SBREF and a control signal $\overline{PGM}$. In accordance with the invention, the circuit 50 functions to provide an active resistance in series with the source 46 of the transistor 40 during the programming cycle to provide process compensation to the transistor, and to provide no resistance during the normal operation of the memory cell which comprises the transistor 40.

The source bias control circuit 100 generates the signal SBREF to control the amount of source bias applied to the EPROM transistor 40 during the programming cycle. The circuit 100 is typically designed to have process tracking with the EPROM transistor 40, and may also have process, supply, temperature and other tracking elements. The source bias element is an active impedance circuit controlled by the source bias control circuit 100, and is used to generate the actual bias condition on the source.

Figure 2:
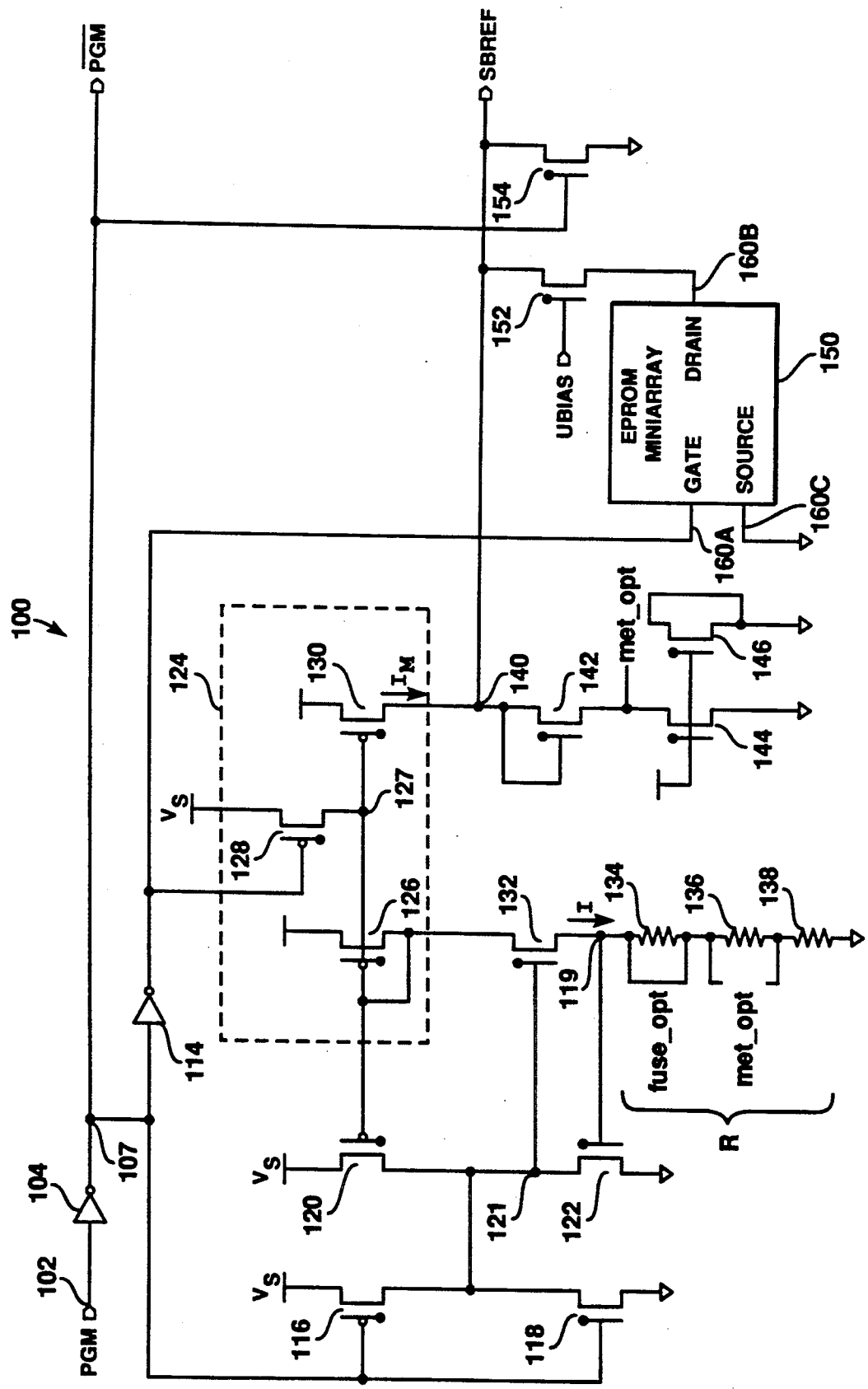
FIG. 2 is a schematic circuit illustrative of the source bias control circuit used in the source bias generator of FIG. 1.

FIG. 2 shows one exemplary embodiment of the source bias control circuit 100. The circuit employs an N-channel transistor threshold drop to develop a reference current which is mirrored to a second stage where EPROM process compensation is introduced. The exemplary circuit 100 is activated by an active PGM signal at node 102, which is inverted by inverter device 104 to provide the control signal $\overline{PGM}$ (node 107), an active low signal. The voltage at node 107 is also inverted by inverter device 114, and the active high signal drives the gate of the P-channel transistor 128 comprising the current mirror circuit 124. A high signal at the gate of the transistor 128 puts the device in the nonconductive state.

A low signal at node 107 turns on P-channel device 116 and turns off N-channel device 118. With device 116 in the conductive state, node 121 is pulled high, turning on N-channel transistor 132 and N-channel transistor 122. Node 121 is therefore at a potential of two threshold drops ($V_t$) above ground. The source of transistor 132 (node 119) is therefore one threshold drop potential above ground. The drain of transistor 132 is connected to the gates of P-channel devices 120, 126 and 130, all of which will be conductive to some extent. Passive resistors 134, 136 and 138 are series connected between the source of transistor 132 and ground, providing a collective resistance R, typically about 4 Kohms. The voltage at node 119, divided by the resistance R, determines the reference current I flowing through the resistors 134, 136 and 138. (The resistor 134 is bypassed by a fuse link, which may be blown to include the resistance; resistor 136 may be bypassed by a metal mask conductor. The resistance options provide the manufacturer with some additional control over the magnitude of the current I, and hence the reference voltage SBREF.)

The gate of device 130 is driven by the same signal as the gate of device 126, so that a mirror current $I_m$ flows through P-channel device 130 into node 140 which is a mirror of the reference current I. The mirror current $I_m$ divides between N-channel transistor 142 and N-channel transistor 152 in an amount determined by the characteristics of the EPROM miniarray 150. With the gate and drain of N-channel transistor 142 tied together (diode configuration), the device will conduct only when node 140 is greater than one threshold drop potential above ground. N-channel device 144 is a long channel N-channel transistor which acts like an active resistor having a fixed resistance. The resistance of circuit 150 is process-dependent, providing process compensation.

Figure 3:
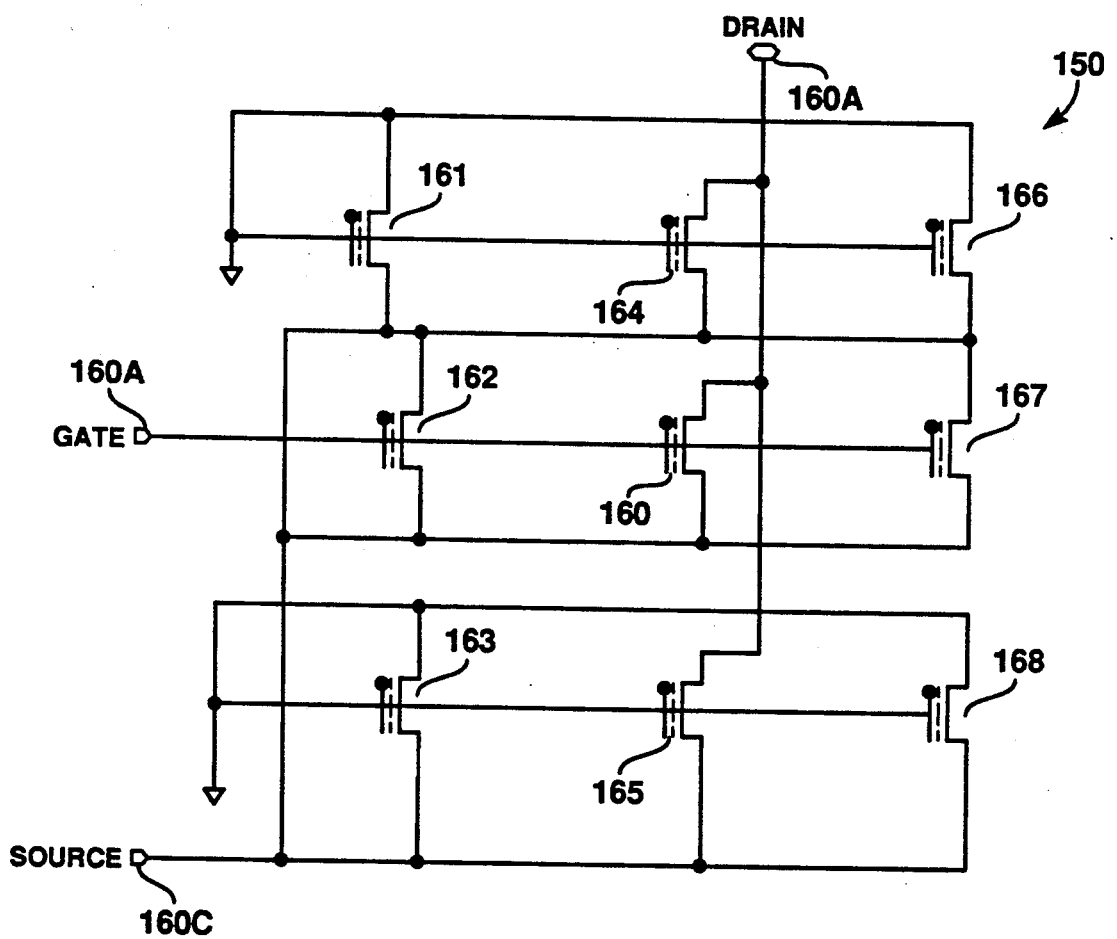
FIG. 3 is an exemplary circuit layout diagram of the EPROM miniarray including a mirror EPROM device comprising the control circuit of FIG. 2.

FIG. 3 shows a simplified circuit layout of an exemplary miniarray 150, which comprises an EPROM transistor 160 identical in size to the EPROM transistor 40 to be programmed. The EPROM transistor 160 is surrounded in the miniarray 150 by several other EPROM transistors 161-168, emulating the layout of the transistor 40 in the EPROM memory array, so that the characteristics of the transistor 161 are as similar as possible to the characteristics of the transistor 40. Only transistor 160 in the array 150 is electrically connected and operational. Thus, the transistor 160 will provide a drain-to-source voltage drop which is process dependent in the same fashion as the transistor 40, so that the voltage at node 140 will be process dependent, in that the voltage SBREF will decrease as more current is diverted through the mirror EPROM transistor 160. Conversely, as the amount of current diverted through transistor 160 is decreased, the voltage SBREF increases.

Figure 4:
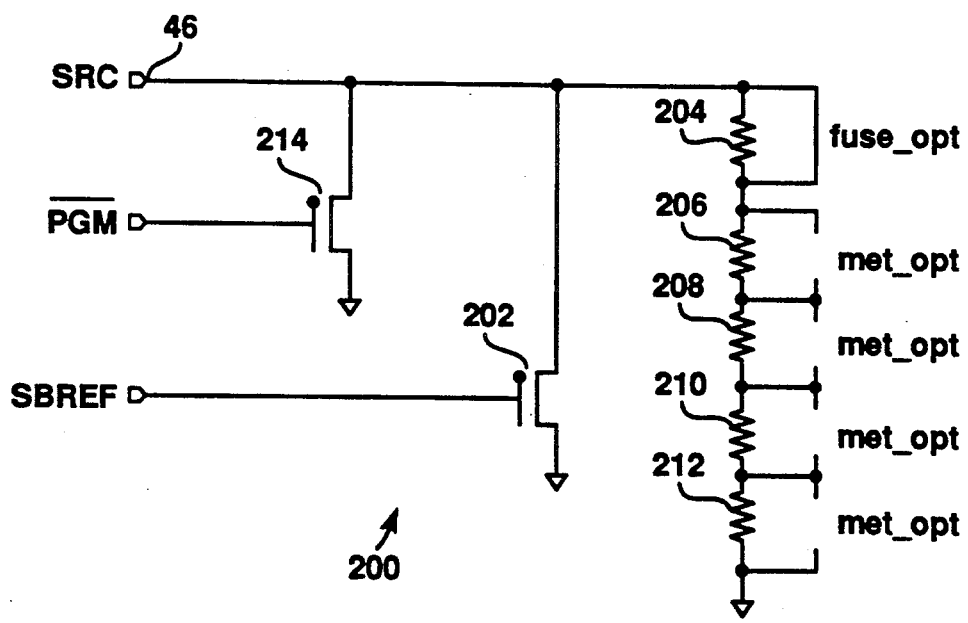
FIG. 4 is a schematic diagram illustrative of an exemplary source bias element circuit used in the source bias generator of FIG. 1.

The source bias control circuit 100 generates the signals SBREF and $\overline{PGM}$ which are used to control each source bias element 200 employed in the semiconductor memory or other device in which the EPROM transistors 40 are employed. FIG. 4 illustrates a preferred embodiment of the source bias element 200 which is connected between the source 46 of the transistor 40 and ground. The circuit 200 comprises the parallel connection of an N-channel transistor 202, which acts as an active resistance, and the series connection of several passive resistors 204, 206, 208, 210 and 212. The passive resistors may be selectively bypassed by fuse (resistor 204) or metal mask options (resistors 206, 208, 210, 212) to select the total passive resistance level, to a maximum of 1.25 Kohm in this example. By appropriate selection of the gate bias on transistor 202, the effective resistance of the parallel element 202 is adjusted so as to vary the voltage drop across the circuit 200 during the programming operation. The gate bias is provided by the voltage SBREF from the control circuit 100. A large bypass transistor 214 selectively pulls the node 46 to ground at all times except during the programming cycle since the resistance of the circuit 200 would be undesirable during an operation such as the reading of the state of the memory transistor 40. The gate of the transistor 214 is driven by signal $\overline{PGM}$, generated by circuit 100, and is high except when the program signal PGM is high.

The effect of the bias circuit 50 is to cause lower source voltages when EPROM transistor conductivity is low, and programming efficiency benefits from higher $V_{DS}$, and higher source voltages when EPROM transistor conductivity is high and lower $V_{DS}$ improves programming efficiency. Applying a greater amount of source bias to a high-conductivity EPROM cell during programming raises the punchthrough voltage of the cell, preventing the bitline voltage from being pulled down. Further, high current in the EPROM transistor results in more electron collisions in the channel, lowering the energy of available electrons and degrading programming performance. Applying greater amounts of source bias (reducing $V_{DS}$ of the EPROM device 40) in this case helps to lower the current during the initial, high current portion of the programming cycle, improving the programming efficiency.

Conversely, with low conductivity EPROM cells the source bias applied to the EPROM transistor can be less. This allows the transistor to have larger gate-to-source and drain-to-source voltage conditions for a slower programming EPROM.

Figure 5:
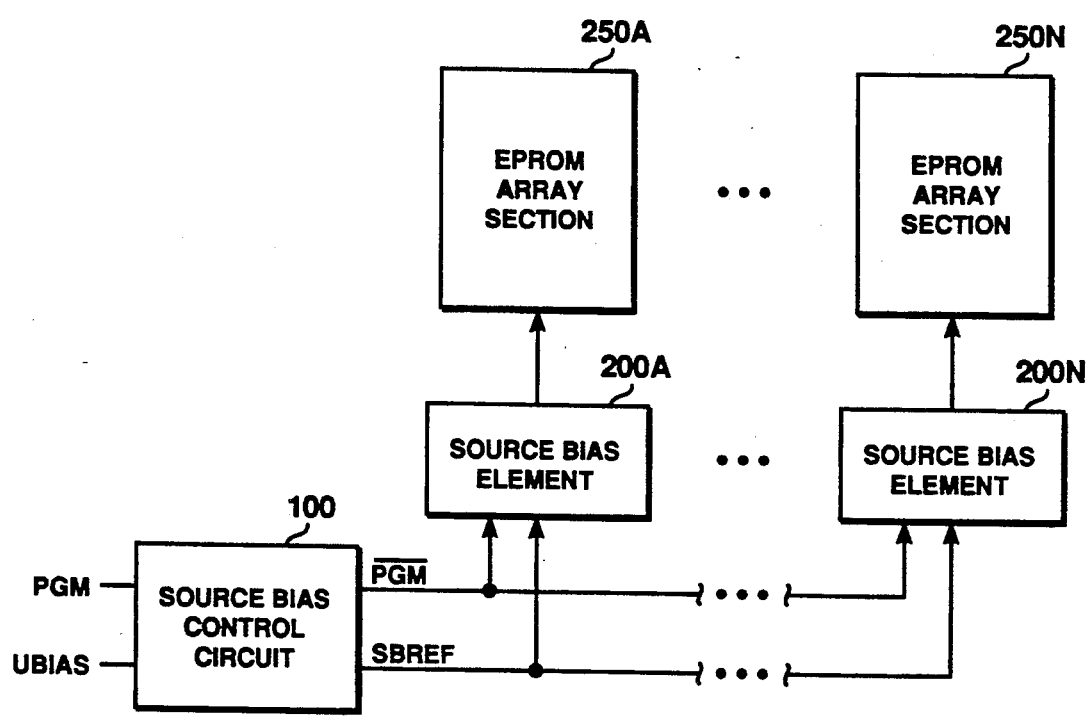
FIG. 5 illustrates an EPROM cell array employing source bias circuitry in accordance with the invention to improve the programming efficiency of the EPROM cells.

It will be understood that in an integrated circuit device such as an EPROM, there will be many EPROM cell transistors, typically arranged in one or more cell arrays. Typically, where all the EPROM cells to be programmed comprise virtually identical EPROM transistors, only one source bias generator circuit 100 need be provided. Each EPROM cell section will be biased by a source bias element 200; thus, a source bias element 200 will be provided for each cell transistor 40 or array section. FIG. 5 illustrates a typical integrated circuit EPROM device arrangement comprising a plurality of EPROM array sections 250A-250N, which may comprise 1—N columns of EPROM cells, only one of which will be selected for programming during a particular programming cycle. Each array section 250A-N is connected to a corresponding source bias element 200A-N. A single source bias generator circuit 100 provides the control signals to the respective source bias elements 200A-N comprising the device.

Figure 6A:
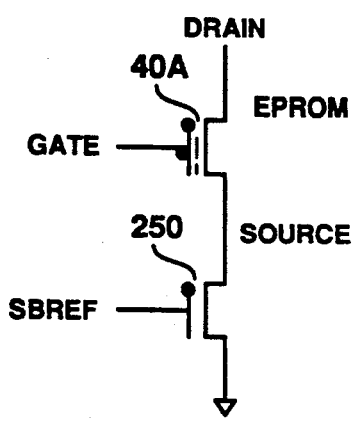
FIGS. 6A-6D show alternate embodiments of the source bias element comprising a source bias circuit in accordance with the invention.
Figure 6B:
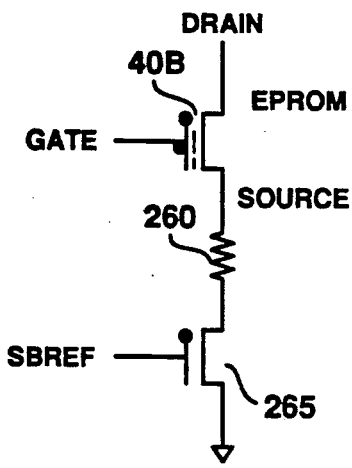
Figure 6C:
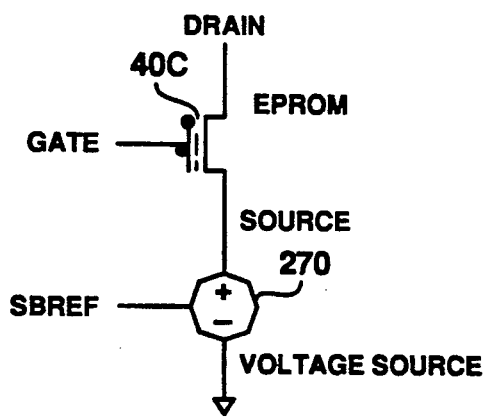
Figure 6D:
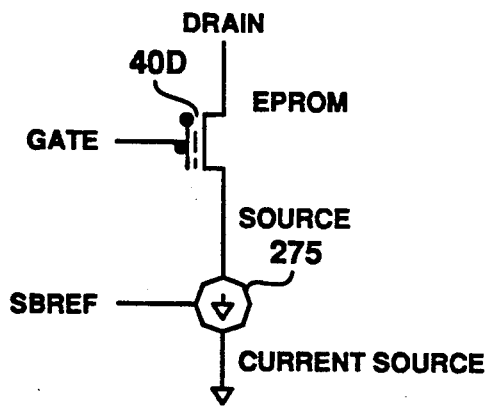

The circuit arrangements of the source bias element 200 as shown in FIG. 4 are merely exemplary of one possible arrangement which may serve the function of an active source bias element. Other embodiments are illustrated in FIGS. 6A-6D. In these Figures, the EPROM transistors 40A-40D correspond to the EPROM transistor 40 in FIG. 1 The circuit of FIG. 6A employs an N-channel transistor 250 in series with the source of the EPROM transistor 40A to be programmed. The gate of the transistor 250 is driven by a control signal such as SBREF to control the active resistance across the drain-to-source of the transistor 250. Thus the arrangement of FIG. 6A depends entirely on the active resistance of the bias transistor 250 to set the source bias on the EPROM transistor 40A. The arrangement of FIG. 6B is like that of FIG. 6A, except a passive resistor 260 is connected in series with the bias transistor 265 to set the source bias on EPROM transistor 40B. The arrangement of FIG. 6C employs a voltage source 270 in series with the source of the EPROM transistor 40C to set the source voltage on device 40C at a level controlled by a control signal from a reference signal generator. The arrangement of FIG. 6D employs a current source 275 in series with the source of EPROM transistor 40D to set the amount of current flowing through the drain-to-source regions of the device 40D at a level controlled by a control signal from a reference signal generator. For simplicity, a bypass transistor responsive to $\overline{PGM}$ to perform the function of transistor 214 (FIG. 4) is not shown in FIGS. 6A-6D.

The circuitry of the present invention includes a reference circuit, which may include process, supply, temperature and other tracking elements, which controls a bias element that provides a voltage on the source node of the EPROM transistor. The invention is particularly useful as EPROM cells become smaller and more sensitive to process variation. The invention allows many devices that would otherwise fail testing because of process variation to program within specifications and therefore become salable products.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. Circuitry for improving the programming efficiency of a floating gate transistor when it is programmed by hot electron programming techniques during a programming cycle, the transistor having respective gate, drain and source nodes, the circuitry comprising:
    a reference voltage generator for generating a reference voltage during said programming cycle, said reference voltage being process-dependent on the conductivity of said floating gate transistor, wherein said reference voltage varies in dependence on the programming characteristics of said floating gate transistor; and
    voltage biasing means responsive to said reference voltage for biasing the voltage on said source node during programming at a low source voltage when said transistor conductivity is low and at a higher source voltage when said transistor conductivity is high,
    wherein the drain-to-source voltage of the transistor being programmed is high when said transistor conductivity is low, and low when said transistor conductivity is high.

2. The circuitry of claim 1 wherein said voltage biasing means comprises a parallel connection of a passive resistance and an active resistance element, said active resistance element responsive to said reference voltage to provide a decreased resistance as said reference voltage increases.

3. The circuitry of claim 1 wherein said floating gate transistor comprises an electrically programmable read only memory integrated circuit device.

4. The circuit of claim 3 wherein said EPROM device comprises a plurality of virtually identical floating gate transistors arranged in an array comprising array sections, each array section comprising one or more floating gate transistors, and said voltage biasing means comprises one active bias element for each array section, and wherein said reference voltage generator provides a common reference voltage to each active bias element.

5. The circuitry of claim 1 wherein said voltage biasing means comprises a voltage source circuit.

6. The circuitry of claim 1 wherein said voltage biasing means comprises a metal-oxide-semiconductor (MOS) transistor device having a gate, drain and source, the source of said MOS transistor device coupled to the source of the floating gate transistor, said reference voltage being applied to the gate of said MOS transistor device to control an impedance across the source to drain of said MOS transistor device to control the voltage on said source node.

7. The circuitry of claim 6 wherein said voltage biasing means further comprises a passive resistance device connected in series with said MOS transistor, whereby an impedance across the voltage biasing means is an impedance of the MOS transistor and the passive resistance device.

8. The circuitry of claim 1 wherein said generator includes a mirror floating gate transistor whose conductivity tracks that of the floating gate transistor being programmed, said reference voltage being dependent on the conductivity of said mirror transistor.

9. The circuitry of claim 8 wherein said generator comprises means for generating a reference current which is divided between two parallel circuit branches, a first branch comprising a substantially fixed resistance element, and the second element comprising said mirror floating gate transistor, said mirror transistor being gated to the conductive state during the programming cycle, wherein said reference current divides between said two parallel circuit branches in a ratio dependent on the conductivity of said mirror transistor.

10. The circuitry of claim 9 wherein said reference voltage is developed across said two parallel circuit branches such that as the conductivity of said mirror transistor increases, the reference voltage decreases, and as the conductivity of said mirror transistor decreases, the reference voltage increases.

11. The circuitry of claim 1 wherein said voltage biasing means is operable to bias the voltage on said transistor source node only during the programming cycle for programming said floating gate transistor.

12. The circuitry of claim 11 further comprising means for coupling the source of said floating gate transistor to ground except during the programming cycle so that said circuitry does not affect the operation of said floating gate transistor except during the programming cycle.

13. The circuitry of claim 12 wherein said coupling means comprises an MOS transistor coupled source-to-drain across said voltage biasing means and gated to the conductive state except during the programming cycle for selectively shorting the source of the floating gate transistor to ground except during the programming cycle.

14. An electrically programmable read only memory (EPROM) integrated circuit device comprising a plurality of EPROM cells, each cell including a floating gate transistor having respective gate, drain and source nodes, which may be selectively programmed during a programming cycle, wherein said cells are arranged in a plurality of columns, each column in turn comprising a plurality of EPROM cells, only one of which cells in a particular column being selected for programming during a given programming cycle, remaining cells in a particular column being characterized as non-selected cells, said EPROM integrated circuit device including circuitry for improving programming efficiency of the floating gate transistors of the EPROM memory cells when they are selectively programmed by hot electron programming techniques, comprising:
   a reference signal generator for generating a process-dependent reference signal during the programming cycle, said reference signal dependent on the conductivity of a mirror floating gate transistor included in said reference signal generator and whose conductivity tracks that of a selected floating gate transistor being programmed; and
   voltage biasing means responsive to said reference signal for biasing the voltage on the source node of said selected floating gate transistor being programmed, including means for biasing said source node of said selected floating gate transistor being programmed at a low source voltage when said transistor conductivity of said selected floating gate transistor being programmed is low and for biasing said source node of said selected floating gate transistor being programmed at a higher source voltage when the conductivity of said selected floating gate transistor being programmed is high;
   wherein the drain-to-source voltage of the selected floating gate transistor being programmed is high when said transistor conductivity of said selected floating gate transistor being programmed is low, and said drain-to-source voltage is low when said transistor conductivity of said selected floating gate transistor being programmed is high.

15. The EPROM device of claim 14 wherein said reference signal is a reference voltage, and said voltage biasing means comprises a parallel connection of a passive resistance and an active resistance element, said active resistance element responsive to said reference voltage to provide a decreased resistance as said reference voltage increases.

16. The EPROM device of claim 14 wherein said mirror transistor is fabricated as a transistor surrounded by other floating gate transistors in a mini-array to emulate the physical characteristics of the floating gate transistor being programmed.

17. The EPROM device of claim 14 wherein said reference signal generator comprises means for generating a reference current which is divided between two parallel circuit branches, a first branch comprising a substantially fixed resistance element, and the second element comprising said mirror floating gate transistor, said mirror transistor being gated to the conductive state during the programming cycle, wherein said reference current divides between said two parallel circuit branches in a ratio dependent on the conductivity of said mirror transistor.

18. The EPROM device of claim 17 wherein said reference signal is a reference voltage and said reference voltage is developed across said two parallel circuit branches such that as the conductivity of said mirror transistor increases, the reference voltage decreases, and as the conductivity of said mirror transistor decreases, the reference voltage increases.

19. The EPROM device of claim 14 wherein said floating gate transistors are virtually identical and arranged in an array comprising array sections, each array section comprising one or more floating gate transistors, and said voltage biasing means comprises one active bias element for each array section.

20. The EPROM device of claim 14 wherein said reference signal is a reference voltage, and said voltage biasing means comprises a metal-oxide-semiconductor (MOS) transistor device having a gate, drain and source, the drain of said MOS transistor device being coupled to the source nodes of said floating gate transistors, said reference voltage being applied to the gate of said MOS transistor device to control an impedance across the source to drain of said MOS transistors to control the source bias voltage on said floating gate transistors.

21. The EPROM device of claim 20 wherein said voltage biasing means further comprises a passive resistance device connected in series with said MOS transistor, whereby an impedance across the voltage biasing means is an impedance of the MOS transistor and the passive resistance device.

22. The EPROM device of claim 14 wherein said voltage biasing means is operable to bias the voltage on said source node of said selected floating gate transistor being programmed only during the programming cycle.

23. The EPROM device of claim 22 further comprising means for coupling the source nodes of said floating gate transistors to ground except during the programming cycle so that said circuitry does not affect the operation of said floating gate transistors except during the programming cycle.

24. The EPROM device of claim 23 wherein said coupling means comprises a metal-oxide-semiconductor (MOS) transistor coupled source-to-drain across said voltage biasing means and gated to the conductive state except during the programming cycle for selectively shorting the source nodes of said floating gate transistors to ground except during the programming cycle.

* * * * *